United States Patent
Kim et al.

[11] Patent Number: 5,982,076
[45] Date of Patent: Nov. 9, 1999

[54] ELECTRONIC COMPONENT INVOLVING 2-TERMINAL TYPE PIEZO-ELECTRIC DEVICE

[75] Inventors: Jong Sun Kim; Il Yong Yun; Min Su Kim, all of Suwon-si; Sang Un Son, Ansan-si, all of Rep. of Korea

[73] Assignee: SAMSUNG Electro-Mechanics Co., Ltd., Kyongki-do, Rep. of Korea

[21] Appl. No.: 08/972,440

[22] Filed: Nov. 18, 1997

[30] Foreign Application Priority Data

| May 28, 1997 | [KR] | Rep. of Korea | 97-12230 |
| May 28, 1997 | [KR] | Rep. of Korea | 97-12231 |
| May 28, 1997 | [KR] | Rep. of Korea | 97-12236 |
| May 28, 1997 | [KR] | Rep. of Korea | 97-12237 |
| Oct. 24, 1997 | [KR] | Rep. of Korea | 97-54882 |

[51] Int. Cl.$^6$ .................................................. H01L 41/053
[52] U.S. Cl. ........................................... 310/348; 310/353
[58] Field of Search ........................... 310/348, 353, 310/365

[56] References Cited

FOREIGN PATENT DOCUMENTS

| 27 37 034 | 10/1978 | Germany | 310/353 |
| 60-94517 | 5/1985 | Japan | 310/353 |
| 62-171214 | 11/1987 | Japan | 310/348 |
| 63-67908 | 3/1988 | Japan | 310/348 |
| 3-28596 | 6/1991 | Japan | H03H 9/17 |
| 5-33847 | 5/1993 | Japan | H03H 9/02 |
| 6-252683 | 9/1994 | Japan | 310/311 |
| 53-7193 | 1/1998 | Japan | 310/348 |

*Primary Examiner*—Thomas M. Dougherty
*Attorney, Agent, or Firm*—Lowe, Hauptman, Gopstein, Gilman & Berner

[57] ABSTRACT

An electronic component involving a two-terminal type piezo-electric device is disclosed. Bent portions are formed on a terminal to fix the device, and a supporting means projects from below a portion between the terminal and a lead to be bent inwardly, so that the connection between the piezo-electric device and the terminals can be firmly and perfectly done, that the supporting portion would be simple to manufacture, and that the flow-down of the solder can be prevented, thereby upgrading the reliability of the component, and improving the aesthetic appearance of the product. The electronic component includes a part 110 having a piezo-electric device 111 and having electrodes 112*a* and 112*b* on both sides of the piezo-electric so as to be overlapped at the middle portion. A terminal part 120 has a terminal 123 for being connected to each electrode of the piezo-electric 111, and the terminal has bent portions 121 with a bending angle α around a center line s so as to surround each end of the piezo-electric 111. A lead part 130 has a lead 132 extending downward from the inner lower end of the terminal, and has a frame 133 extending downward from the lower end of the lead 132. A supporting part 140 has a supporting means 141 which extends downward integrally from the connecting portion between the terminal 123 and the lead 132, and which is bent with a bending angle β to support the piezo-electric 111.

7 Claims, 8 Drawing Sheets

ELECTRONIC COMPONENT INVOLVING 2-TERMINAL TYPE PIEZO-ELECTRIC DEVICE

BACKGROUND OF THE INVENTION

1. Field of the Invention

The present invention relates to an electronic component involving a two-terminal device, in which a piezo-electric device utilizing the piezo-electric effect is installed on a circuit board. More specifically, the present invention relates to an electronic component involving a two-terminal type piezo-electric device, in which the connection of the terminals to the piezo-electric device is facilitated by the terminals (connected to the piezo-electric device), lead wires extended from the terminals, and a supporting means for supporting the piezo-electric device, thereby firmly maintaining the connection state so as to upgrade the reliability of the electronic component.

2. Description of the Prior Art

Generally, a piezo-electric device resorts to the piezo-electric effect, i.e., to a mutual converting function between the electric energy and the mechanical energy. Thus the piezo-electric device serves as the operation source for reference signals of a microprocessor. This piezo-electric device is mostly used on electronic apparatus such as pagers, mobile communication means, televisions, audio sets and the like. At present, its demand is speedily increased. The method for manufacturing an electronic device involving the piezo-electric device includes the steps of: manufacturing a piezo-electric device; forming electrodes by depositing and patterning an electrode layer on the surface of the piezo-electric device; installing the piezo-electric device on a circuit board; and dotting, epoxy-coating and marking the device. The piezo-electric device and the terminal component are coupled together by soldering, and then, molding is carried out to form a packaged electronic component.

Japanese Utility Model Publication No. Hei-3-28596 discloses a two-terminal piezo-electric device in which the terminals mutually face each other from both sides of the piezo-electric device so as to connect the piezo-electric device.

Figure 1:
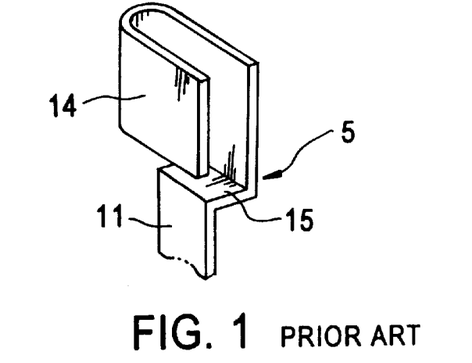
FIG. 1 is a perspective view of the critical portion showing a conventional two-terminal type piezo-electric component.
Figure 2:
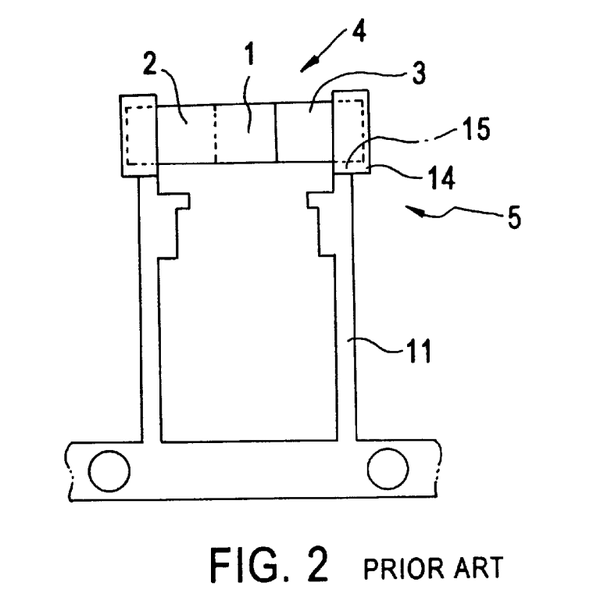
FIG. 2 is a front view showing the conventional two-terminal type piezo-electric component.
Figure 3:
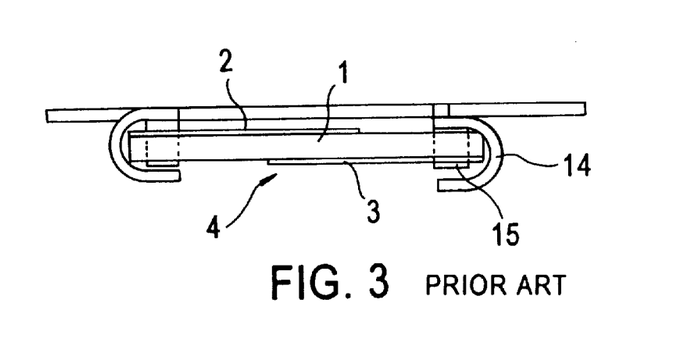
FIG. 3 is a top plan view showing the conventional two-terminal type piezo-electric component.

FIG. 1 is a perspective view of the critical portion of a conventional two-terminal piezo-electric device. FIG. 2 is a front view showing the constitution of the entire portion of the conventional two-terminal piezo-electric component. FIG. 3 is a top plan view of the piezo-electric component of FIG. 2.

As shown in FIGS. 1 to 3, the above described two-terminal piezo-electric component includes: a piezo-electric device 4 having electrodes 2 and 3 installed on different faces of a piezo-electric substrate 1; and two terminals 5 electrically connected to the electrodes 2 and 3 of the piezo-electric device 4. The above described two-terminal piezo-electric component further includes a planar lead portion 11 lying on the same plane as both of the side surfaces of another lead portion 11 so as to constitute the two terminals 5. A supporting portion 14 is formed integrally with the lead portion 11 and has U shaped side openings for supporting both ends of the piezo-electric device 4. A stopper portion 15, bendingly formed near the boundary between the supporting portion 14 and the lead portion 11, blocks the greater part of the lower portion of the opening to prevent the movement of the piezo-electric device 4 toward the lead portion 11. The supporting portion 14 is electrically connected to the electrodes 2 and 3.

In the above described two-terminal type piezo-electric component, as shown in FIGS. 1 to 3, the piezo-electric device having the electrodes 2 and 3 is electrically connected to the two terminals 5. The piezo-electric device 4 is supported by the two bent portions of the supporting portion 14 which is connected through the stopper portion 15 to the lead portion 11. The stopper portion 15 is formed in a rectangularly bent contour between the supporting portion 14 and the lead portion 11. The stopper portion 15 substantially closes the lower opening of the supporting portion 14 so that the movement of the piezo-electric device 4 in the lower direction can be prevented. Thus, the piezo-electric device 4 which is supported by the supporting portion 14 is electrically connected through the electrodes 2 and 3 to the supporting portions 14.

However, in the above described two-terminal type piezo-electric component as shown in FIGS. 1 to 3, the stopper portion 15 cannot be actually rectangularly bent during the manufacture of the terminals 5. Accordingly, the lower opening of the terminal 5 cannot be perfectly closed, and the molten soldering material flows down during their coupling. Further, when the piezo-electric device 4 is placed into the U shaped supporting portions 14 of the terminals 5, the piezo-electric device 4 cannot be fixed in an accurate position.

Further, during the manufacture of the supporting portions 14 and the stopper portions 15 of the terminals 5, a planar strip has to be bent many times, with the result that the manufacturing work becomes difficult.

SUMMARY OF THE INVENTION

The present invention is intended to overcome the above described disadvantages of the conventional technique.

Therefore it is an object of the present invention to provide a two-terminal type piezo-electric component in which a bent portion is formed on a terminal portion to easily fix a piezo-electric device, and a supporting means projects from below a connecting portion between the terminal and a lead to be bent inwardly, so that the connection between the piezo-electric device and the terminals can be firmly and perfectly carried out, that the supporting portion is simple to simplify the manufacture of the terminals, and that the flowing-down of the soldering material can be prevented, thereby upgrading the reliability of the electronic component, and improving the aesthetic appearance of the product (owing to a uniform molding).

It is another object of the present invention to provide a two-terminal type piezo-electric component in which the bottom of the piezo-electric device is firmly supported by a downwardly projected and inwardly bent supporting means, so that the piezo-electric device can be easily and firmly connected to the terminals, thereby upgrading the reliability of the product.

In achieving the above objects, the electronic component involving a piezo-electric device according to the present invention includes: a device part having a piezo-electric device and having electrodes on both sides of the piezo-electric device in such a manner as to be overlapped at the middle portion; a terminal part having a terminal for being electrically connected to each electrode of the piezo-electric device, the terminal having bent portions with a certain bending angle α around a center line s so as to surround each end of the piezo-electric device; a lead part having a lead extending downward from the inner lower end of the terminal, and having a frame extending downward from the lower end of the lead; and a supporting part having a supporting means, the supporting means extending downward integrally from the connecting portion between the terminal and the lead, and being bent with a certain bending angle β to support the piezo-electric device.

In another aspect of the present invention, the electronic component involving a piezo-electric device according to the present invention includes: a device part having a piezo-electric device and having electrodes on both sides of the piezo-electric device in such a manner as to be overlapped at the middle portion; a terminal part having a terminal for being electrically connected to each electrode of the piezo-electric device, and having bent portions with a certain bending angle α around a center line s so as to surround each end of the piezo-electric device; a lead part having a lead extending downward from the inner lower end of the terminal, and having a frame extending downward from the lower end of the lead; and a supporting part having a supporting means integrally extending downward from an inner planar portion of the terminal, and rectangularly bent toward the interior of the terminal.

BRIEF DESCRIPTION OF THE DRAWINGS

The above objects and other advantages of the present invention will become more apparent by describing in detail the preferred embodiment of the present invention with reference to the attached drawings in which.

DETAILED DESCRIPTION OF THE PREFERRED EMBODIMENTS

FIGS. 4 to 9 illustrate a first embodiment of the present invention.

The first embodiment provides an electronic component having a two-terminal component 100 for a piezo-electric device. The first embodiment of the present invention includes a device part 110, a terminal part 120, a lead part 130 and a supporting part 140.

Figure 4:
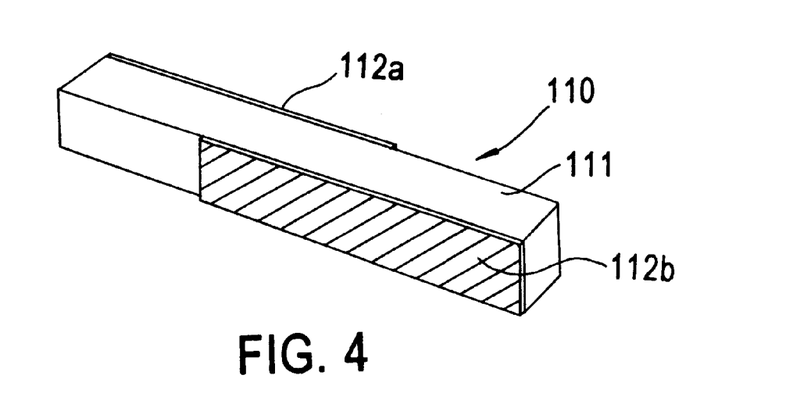
FIG. 4 is a perspective view of the piezo-electric device according to the present invention.
Figure 5:
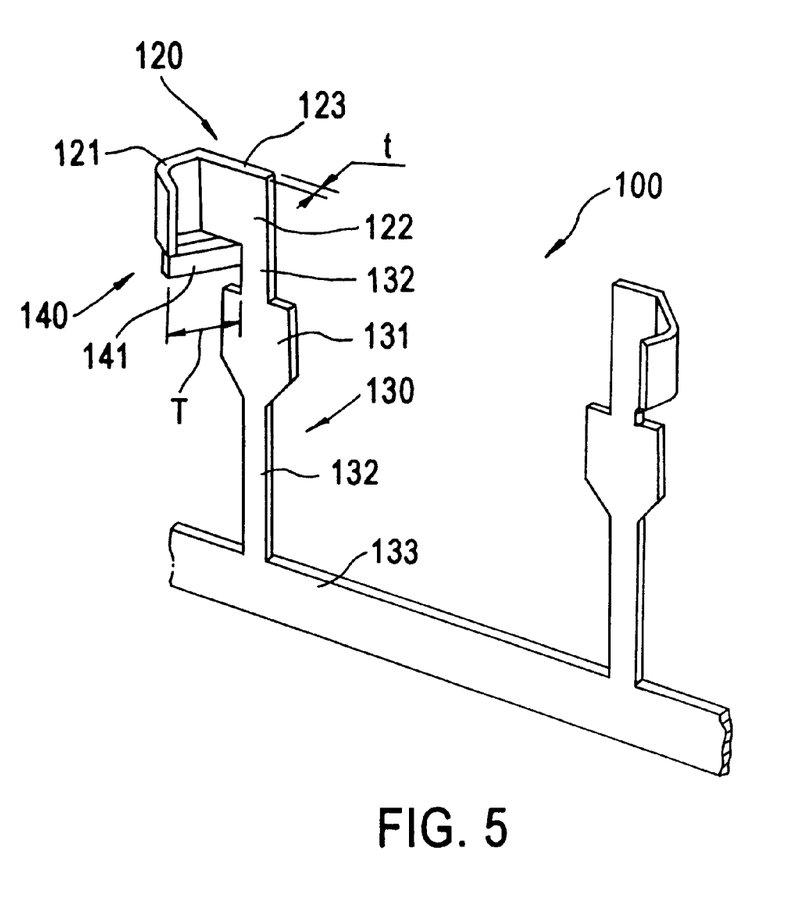
FIG. 5 is a perspective view of the two-terminal component for the piezo-electric device according to the present invention.
Figure 6:
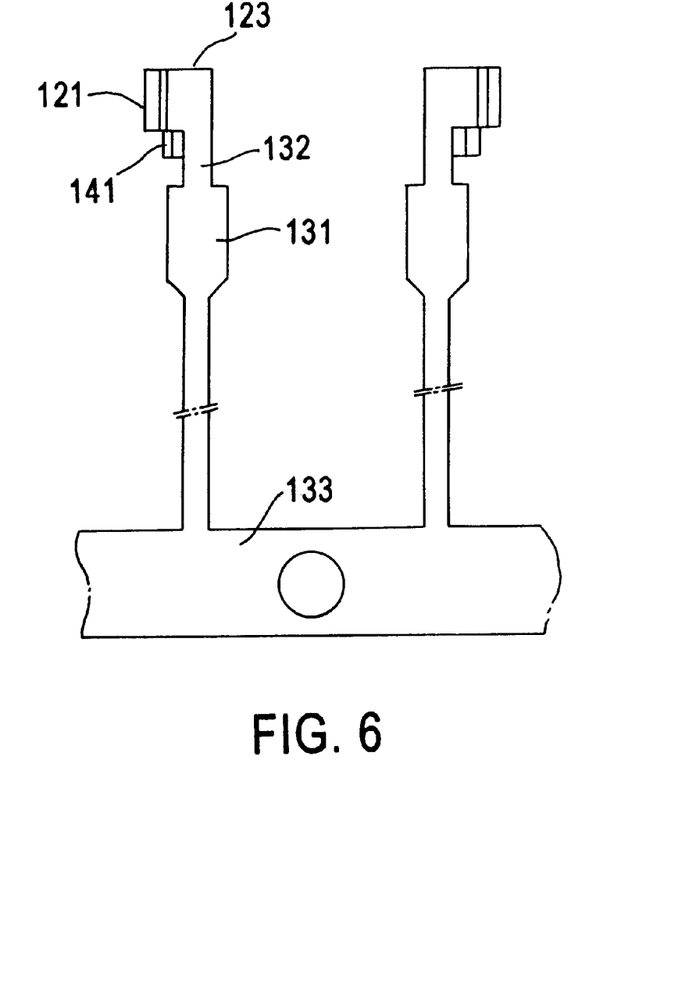
FIG. 6 is a front view of the two-terminal component for the piezo-electric device according to the present invention.
Figure 7:
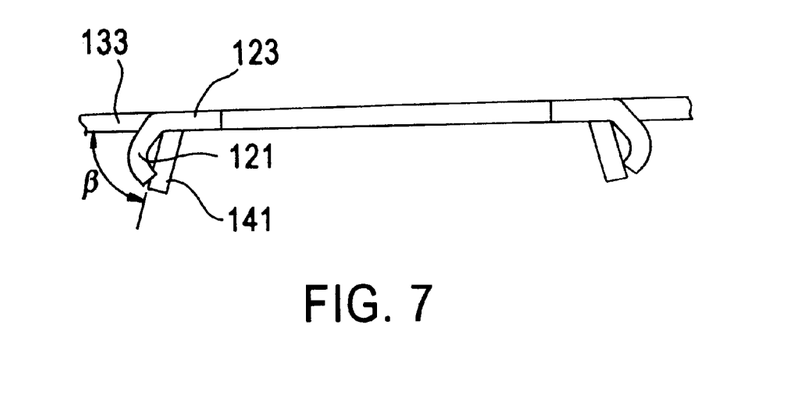
FIG. 7 is a top plan view of the two-terminal component for the piezo-electric device according to the present invention.
Figure 8:
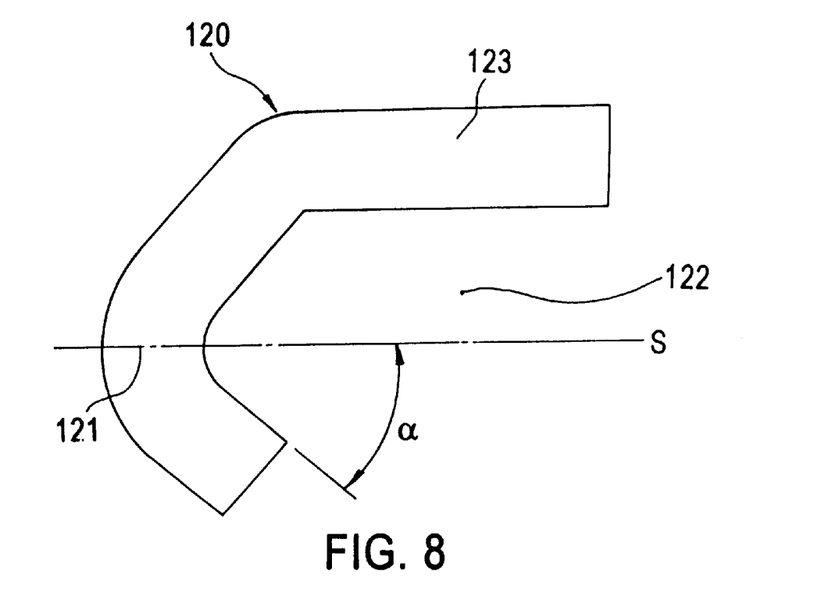
FIG. 8 is a plan view showing the critical portion of the bent portion of the terminal.
Figure 9:
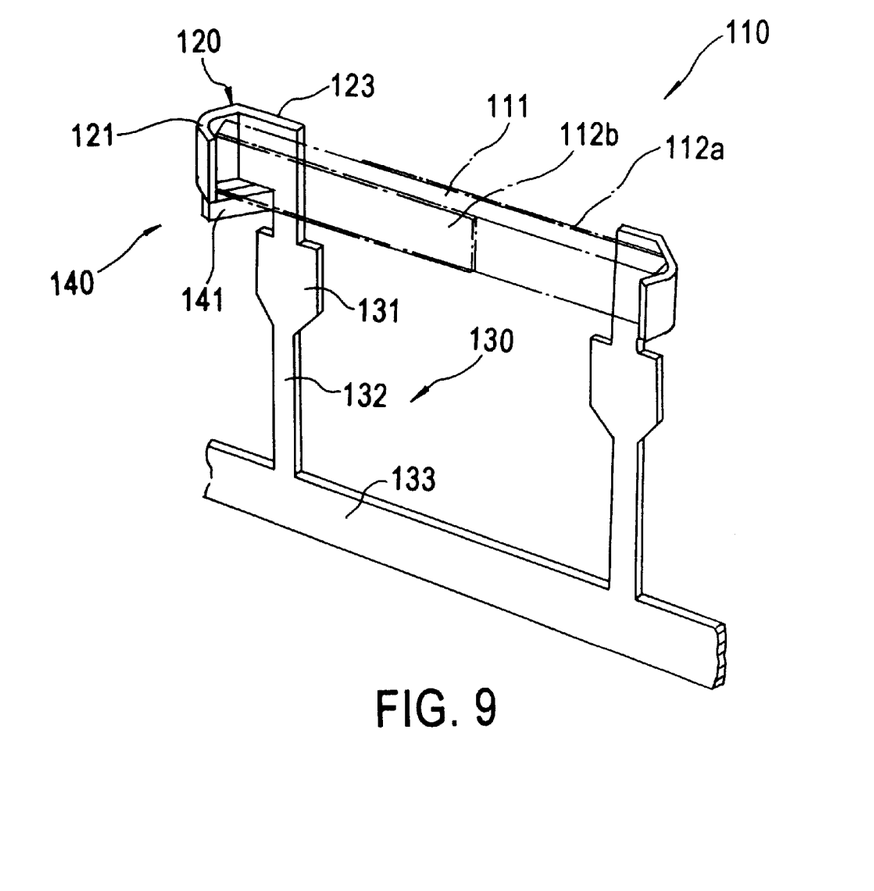
FIG. 9 is a perspective view of a first embodiment of the two-terminal component for the piezo-electric device according to the present invention.

As shown in FIG. 4, in the device part 110, a piezo-electric device 111 is provided such that two electrodes 112a and 112b respectively extend from the ends of the device part 110 toward the center of it to be overlapped at the center of it. The piezo-electric device is preferably made of a ceramic material.

The terminal part 120 is connected to each end of the piezo-electric device 111. As shown in FIGS. 5 to 9, the terminal part 120 is provided with an inward opening 122 for coupling with one end of the piezo-electric device 111. To form the opening 122, a terminal 123 has bent portions 121 with a bending angle α around a center line s. Two of the terminals 123 mutually face from each other to surround both ends of the piezo-electric device 111. The both ends of the piezo-electric device 111 are connected to two electrodes 112a and 112b by means of soldering or the like.

The bending angle α (see FIG. 8) of the bent portion 121 of the terminal part 120 is 40–45°, and preferably 42°. The bent portion 121 of the terminal part 120 is approximately V-shaped, with its inner middle portion being rounded.

The lead part 130 is for installing the terminal 123 onto a main circuit board (not shown in the drawings), with the terminal 123 having received the piezo-electric device 111. As shown in FIGS. 5 to 9, the lead part 130 consists of a lead 132 extending downward from the lower end of the terminal 123 and having a reinforcing portion 131. The lower end of the lead 132 joins with a frame 133 in an integral form.

Further, the supporting part 140 firmly supports the piezo-electric device 111 which is received into the terminal 123. As shown in FIGS. 5 to 9, the supporting part 140 includes a supporting means 141 which closes the bottom of the terminal 123 and projects transversely to the length of the piezo-electric device 111. The supporting means 141 is bent from the terminal 123 with a bending angle β (see FIG. 7). The bending angle β is 83–87°, and preferably 85°. The length T of the supporting means 141 should be larger than the thickness t of the lead 132.

The first embodiment of the present invention constituted as above will now be described as to its action.

The piezo-electric device 111 is made of a ceramic material. As shown in FIGS. 4 to 9, the electrodes 112a and 112b respectively extend from both ends of the piezo-electric device toward the middle portion thereof where these electrodes overlap. Therefore, if power is supplied to the piezo-electric device, a resonance frequency is generated from between the overlapped electrodes 112a and 112b. Thus the piezo-electric device serves as a piezo-electric resonance device, i.e., as an oscillation generating source. This is called "ceramic oscillator".

Further, correspondingly with the both ends of the piezo-electric device 111, two terminals 123 with two openings 122 face to each other. The terminal 123 has bent portions 121 with a bending angle α, and therefore, both end portions of the piezo-electric device 111 are surrounded by the terminals 123 and are fixed to the terminals by soldering or the like.

Meanwhile, the bending angle α of the bent portion 121 of the terminal 123 should be preferably 40–45°, and more preferably 42°. When both end portions of the piezo-electric device 111 are disposed within the bent portions 121 of the terminals 123, the piezo-electric device 111 can be accurately positioned and fixed within the terminals 123. Thus, the piezo-electric devices can be fixed uniformly during the production, and any loose movement between the piezo-electric device 111 and the terminals 123 can be prevented, thereby stabilizing the connection state. Under this condition, if the bending angle α is less than 40°, the piezo-electric device 111 cannot be received into the terminals. On the other hand, if the bending angle α is more than 45°, the openings of the terminals 123 become too large, and therefore, the fixing of the piezo-electric device 111 becomes unstable.

Soldering reinforces the coupling between the piezo-electric device 111 and the terminals 123. The bent portion 121 has an approximately V shaped rounded inside to make it easy to carry out the soldering.

Further, the lead 132 which extends from the inner lower end of the terminal 123 is provided with a reinforcing portion 131. The lower end of the lead 132 joins with the frame 133 in an integral form. This two-terminal type component 100 is provided mutually facingly in a number of two to support the piezo-electric device 111. Therefore, if the leads 132 are installed on a main circuit board (not shown in the drawings), power can be supplied through the leads 132 to the piezo-electric device 111. Owing to the reinforcing portion 131, the strength of the lead 132 is improved.

Further, the supporting means 141 projects from the connecting point between the terminal 123 and the lead 132 with a bending angle β to be extended to the tip of the terminal 123. The supporting means 141 support both end portions of the piezo-electric device 111, which have been inserted into the terminals 123. Thus the coupling state of the piezo-electric device is more firmly maintained, and at the same time, the molten soldering material is prevented from flowing down.

The bending angle β of the supporting means 141 should be 83–87°, and preferably should be 85°. If the bending angle β is less than 83°, the supporting means 141 is biased to the rear portion of the terminal 123. On the other hand if it is more than 87°, the supporting means 141 is biased to the front portion of the terminal 123. Consequently, the supporting and fixing state of the piezo-electric device 111 becomes unstable. Further, the length T of the supporting means 141 is formed larger than the thickness t of the lead 132 of the lead part 130, so that the lead 132 would be strong enough even after the bending of the supporting means 141, thereby making it possible to prevent an unstable supporting state of the piezo-electric device 111.

Therefore, the piezo-electric device 111 is secured into the terminals 123 each of which has bent portions 121 with a bending angle α. Further, the piezo-electric device 111 is supported by the supporting means 141 which has been bent from the lead 132. Therefore, the work for connecting the piezo-electric device 111 to the terminals 123 is carried out in an easy manner with a firm securing result. Consequently, the reliability of the product is upgraded.

Figure 10:
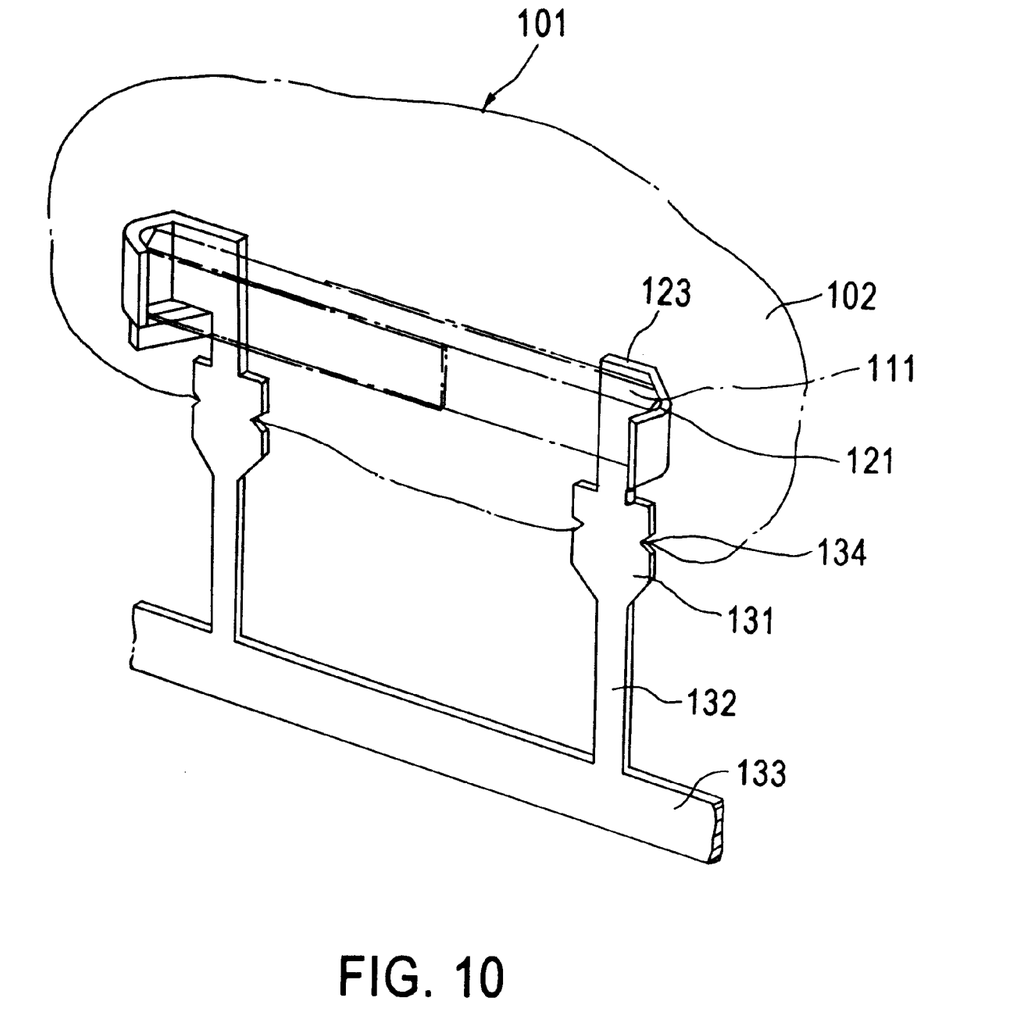
FIG. 10 is a perspective view showing a second embodiment of the present invention.

FIG. 10 illustrates a second embodiment of the present invention. The principal feature of the second embodiment is that the molding process 102 which is the finish step for the electronic component 101 involving the two-terminal type piezo-electric device is rendered easier.

In the second embodiment of the present invention, triangular slots 134 are formed on the side edges of the reinforcing portion 131 which is a part of the lead 132 of the lead part 130. Therefore, during the molding process, the molding material 102 is filled into the triangular slots 134. When the molding material is solidified, the molding state becomes firm. Further, owing to the triangular slots 134, the molding process can be carried out in an easy manner. Further, the molding material is uniformly spread, thereby improving the aesthetic appearance of the product.

FIGS. 11 to 16 illustrate third, fourth and fifth embodiments of the present invention.

The principal feature of the third to fifth embodiments of the present invention is as follows. That is, supporting means 241, 242, 243 and 243' of a supporting part 240 which supports the piezo-electric device are first made to integrally extend downward from the inner and outer bottoms 124 and 124' of the terminal 123. Then the supporting means are bent rectangularly so as to support the piezo-electric device 111.

In describing the third to fifth embodiments of the present invention, the elements same as those of the first embodiment will be assigned with the same reference codes.

Figure 11:
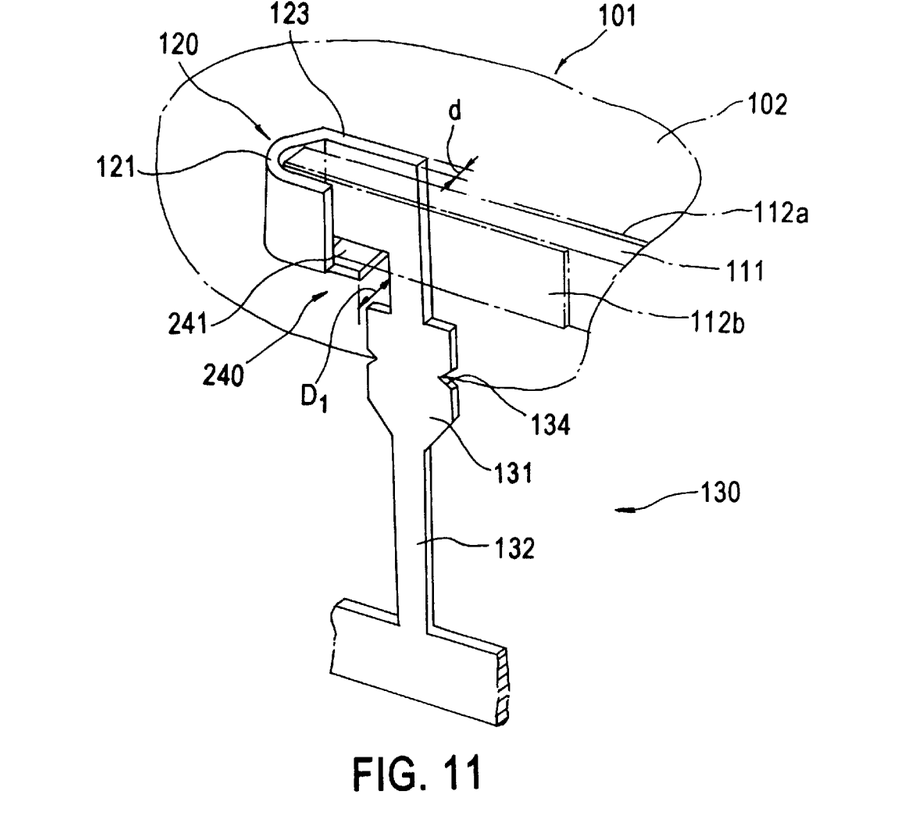
FIG. 11 is a perspective view showing a third embodiment of the present invention.
Figure 12:
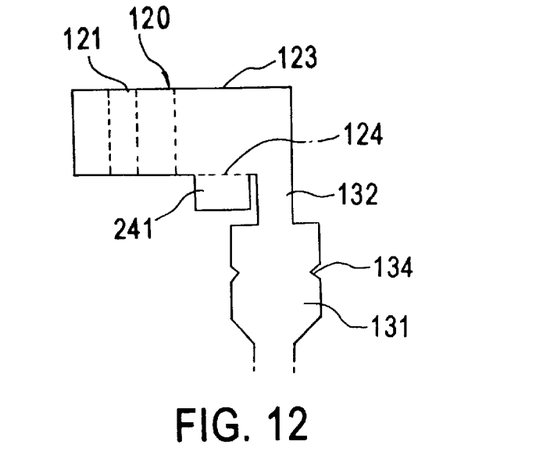
FIG. 12 is an extended view of the third embodiment of the present invention.

The third embodiment of the present invention is illustrated in FIGS. 4, 11 and 12. As shown in these drawings, the electronic component includes a device part 110, a terminal part 120, a lead part 130 and a supporting part 240. The device part 110, the terminal part 120 and the lead part 130 have the same constitutions as those of the first embodiment, while their actions are also same.

Meanwhile, the supporting part 240 which supports the piezo-electric device 111 integrally extends downward from the inner bottom 124 of the terminal 123 of the terminal part 120, and then is bent rectangularly so as to form a supporting means 241. Therefore, in a state with the piezo-electric device 111 supported by the supporting means 241 within the curved terminal 120, the piezo-electric device 111 is electrically connected to the terminal 123. Therefore, the connecting work becomes easier, and the connection becomes firm.

Figure 13:
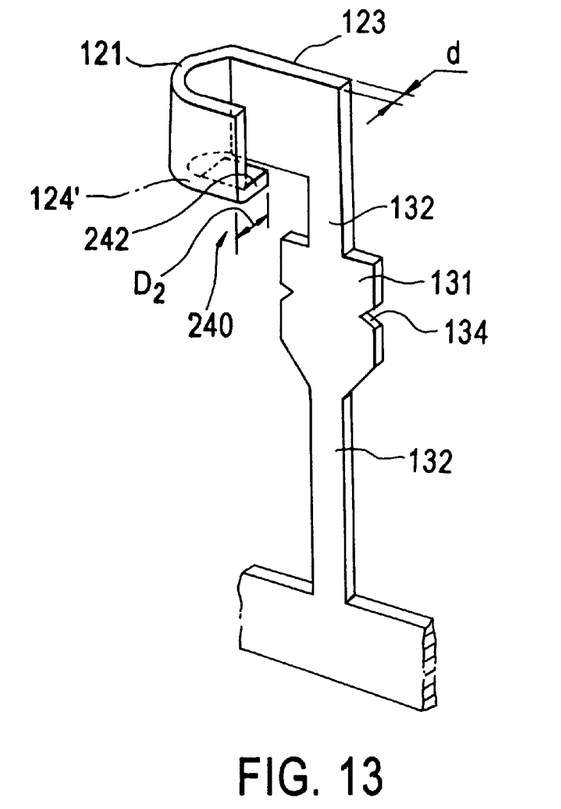
FIG. 13 is a perspective view showing a fourth embodiment of the present invention.
Figure 14:
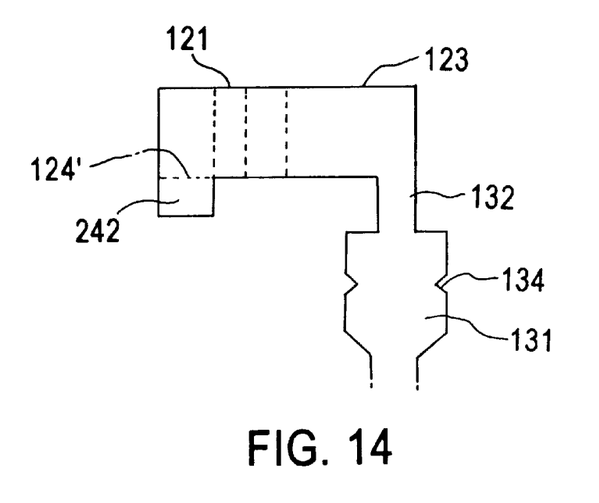
FIG. 14 is an extended view of the fourth embodiment of the present invention.

The fourth embodiment of the present invention is illustrated in FIGS. 4 and 13 to 14. As shown in these drawings, the supporting means 242 of the supporting part 240 integrally extends from an outer bottom 124' of the terminal 123, and then is bent rectangularly inwardly. Thus, the supporting means 242 supports the piezo-electric device 111 during its connection to the terminal 123.

In the third and fourth embodiments of the present invention, there is a difference between the two such that the supporting means 241 for supporting the piezo-electric device 111 extends from the inner bottom of the terminal 123 in one of them, and the supporting means 242 extends from the outer bottom of the terminal 123 in another. Therefore, the manufacture of the electronic component becomes easy for various sizes of dies and the piezo-electric device 111.

Figure 15:
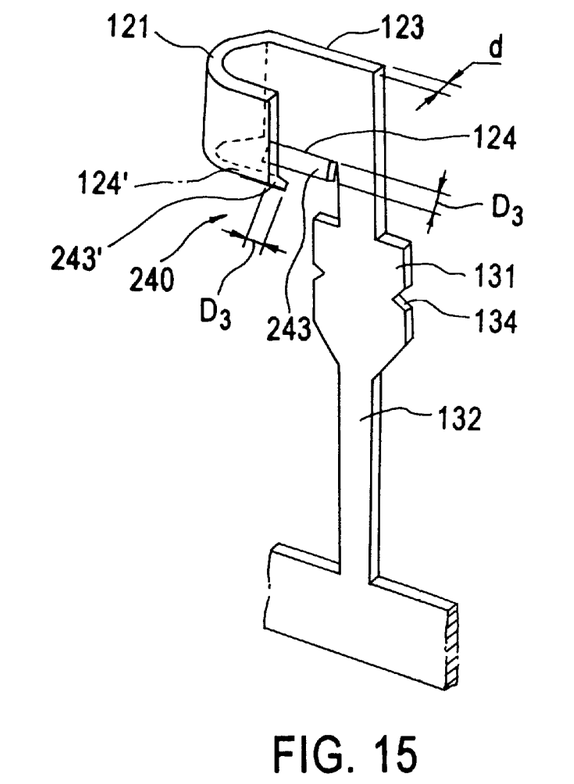
FIG. 15 is a perspective view showing a fifth embodiment of the present invention.
Figure 16:
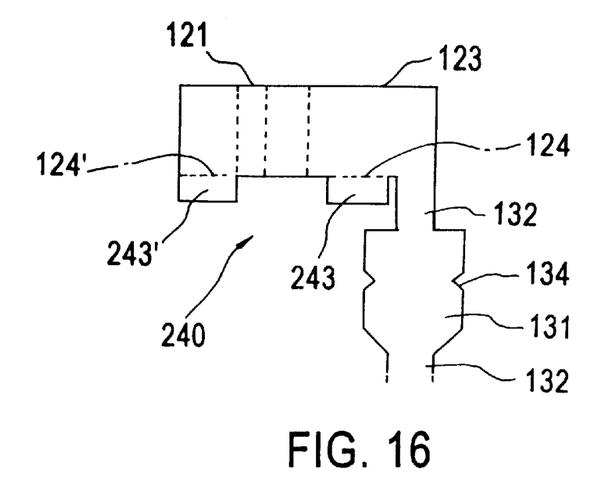
FIG. 16 is an extended view of the fifth embodiment of the present invention.

The fifth embodiment of the present invention is illustrated in FIGS. 4 and 15 to 16. As shown in these drawings, the supporting means 243 and 243' of the supporting part 240 integrally extend from inner and outer bottoms 124 and 124' of the terminal 123, and then are bent rectangularly inwardly with a bending angle of 40–50°, and preferably with a bending angle of 45°. Thus the supporting means 243 and 243' which extend from the bottoms 124 and 124' of the terminal 123 and are bent with 45° support the piezo-electric device 111. If the supporting means 243 and 243' are bent with a bending angle smaller than 40°, they cannot firmly support the piezo-electric device 111. On the other hand, if the bending angle is larger than 50°, then the supporting means 243 and 243' interfere to each other. Thus in the fifth embodiment of the present invention, the supporting means 243 and 243' can support the piezo-electric device 111 in a convenient manner for its various sizes.

Meanwhile, in the third to fifth embodiments of the present invention, as shown in FIGS. 11 to 16, the lengths D1, D2 and D3 of the supporting means 241, 242, 243 and 243' are made larger than the thickness d of the terminal 123, so that the supporting means 241, 242, 243 and 243' can support the piezo-electric device in a stable manner.

According to the present invention as described above, a bent portion (supporting means) extending from the terminal supports the piezo-electric device in a convenient manner. Further, the positioning and the electrical connection of the piezo-electric device to the terminal are rendered easier by the supporting means. Further, the manufacturing process for the terminal becomes simple, and during a soldering, the soldering material is prevented from flowing down. Consequently, the reliability of the electronic component is upgraded. Further, the molding process after the connection between the piezo-electric device and the terminals become uniform, with the result that the aesthetic appearance of the product is improved.

What is claimed is:

1. An electronic component for use with a piezo-electric device, comprising:

a pair of terminal parts each including a terminal and a bent portion projecting from a side portion of said terminal, said bent portion having a rounded-V shape in top plan view;

a pair of leads directly attached to a lower end of said terminals, respectively, wherein an entire extent of each lead directly attached to said terminal resides in the same plane as said terminal;

a frame connected to lower ends of said leads; and further including a pair of supporting parts respectively extending along a side edge of each lead closest to the bent portion to define a bottom within the rounded-V shape adapted, to support a piezo-electric device.

2. The component of claim 1, further comprising said piezo-electric device having opposite ends respectively supported on said supporting parts.

3. The component of claim 2, wherein each supporting part is integrally formed with said side edge as a bent member extending from said side edge towards said bent portion with a distal end of said bent member located adjacent and below the bent portion.

4. The component of claim 2, wherein each supporting part is integrally formed with a bottom edge of said terminal and as a bent member having a distal edge extending towards said bent portion.

5. The component of claim 5, wherein each supporting part is integrally formed with a lower edge of said bent portion and as a bent member having a distal end projecting towards a bottom edge of said terminal.

6. The component of claim 2, wherein each supporting part includes first and second supporting parts defining said bottom, said first supporting part being integrally formed with a bottom edge of said terminal, said second supporting part being integrally formed with a bottom edge of said bent portion, both said first and second supporting parts being bent members such that distal edges thereof are in opposition to each other.

7. An electronic component for use with a piezo-electric device, comprising:

a pair of terminal parts each including a terminal and a bent portion projecting from a side portion of said terminal, and including a bottom extending between said bent portion and said terminal to define a recess adapted for receiving an end of said piezo-electric device in supporting contact therewith;

a pair of leads directly attached to a lower end of said terminals, respectively, wherein an entire extent of said terminal and an entire extent of each lead is substantially flat to reside in the same plane with each other; and a frame connected to lower ends of said leads.

* * * * *